(12) United States Patent
Souriau et al.

(10) Patent No.: US 8,039,285 B2
(45) Date of Patent: Oct. 18, 2011

(54) THIN FILM GETTER PROTECTION (75) Inventors: Jean-Charles Souriau, Saint Egreve (FR); Elisabeth Delevoye, Grenoble (FR); Francois Baleras, Seyssinet (FR); David Henry, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 1047 days.

(21) Appl. No.: 11/817,901

(22) PCT Filed: Mar. 10, 2006

(86) PCT No.: PCT/FR2006/050206
§ 371 (c)(1),
(2), (4) Date: Sep. 6, 2007

(87) PCT Pub. No.: WO2006/097652
PCT Pub. Date: Sep. 21, 2006

(65) Prior Publication Data
US 2008/0213539 A1 Sep. 4, 2008

(30) Foreign Application Priority Data
Mar. 14, 2005 (FR) ..................................... 05 50649

(51) Int. Cl.
*H01L 21/00* (2006.01)
(52) U.S. Cl. ...................... 438/51; 438/64; 257/E21.499
(58) Field of Classification Search .................... 438/51, 438/64
See application file for complete search history.

(56) References Cited

U.S. PATENT DOCUMENTS

| 4,426,769 A | 1/1984 | Grabbe |
| 2003/0138656 A1 | 7/2003 | Sparks |
| 2004/0189195 A1 | 9/2004 | Allemand |

FOREIGN PATENT DOCUMENTS

| JP | 2000-243281 A | 9/2000 |
| WO | WO 02/42716 A2 | 5/2002 |

OTHER PUBLICATIONS

Jin Y., et al. "MEMS Vacuum Packaging Technology and Applications", IEEE Electronics Packaging Technology Conference, 2003, pp. 301-306.

Japanese Office Action issued on Feb. 22, 2011 in corresponding Japanese Application No. 2008-501381 (with an English Translation).

*Primary Examiner* — Alexander Ghyka
(74) *Attorney, Agent, or Firm* — Oblon, Spivak, McClelland, Maier & Neustadt, L.L.P.

(57) ABSTRACT

A method for installing a sorption element in a cavity including: disposing, within the cavity, a getter material, a reaction material, and a protective material, the protective material covering at least one part of the getter material so as to bury the at least one part; raising a temperature up to at least one removal temperature; and moving the protective material towards the reaction material by reaction between the protective material and the reaction material so that at least one portion of the part of the getter material is no longer covered with the protective material.

20 Claims, 7 Drawing Sheets

THIN FILM GETTER PROTECTION

TECHNICAL FIELD

The invention concerns the field of maintaining a vacuum in cavities, particularly for microelectronic devices. More specifically, the invention is connected with the sorption elements, more generally known as "getters", present in these cavities.

The invention refers in particular to getters in the form of thin films, and it relates to a method enabling a temporary protection of these reactive components during the manufacture of the cavity, and not altering their properties.

The invention thus concerns installing a protective material that reacts during a heat treatment to pass from a form of protective zone covering the getter to an element separated from the sorption layer.

STATE OF THE PRIOR ART

Encapsulation, or "packaging", is today one of the keys to the development of microsystems, in particular mechanical microsystems such as MEMS (Micro Electro Mechanical Systems) or infrared detectors. For example, for components such as non-cooled resonators or bolometers, it is necessary to isolate the component in a cavity under a more or less strong vacuum.

The encapsulation may be carried out individually (by chip) in a hermetic enclosure, or at the level of the substrate (wafer level packaging); different techniques are used, such as for example the transfer of a lid by hermetic sealing, or the manufacture of a hermetic cavity around the device by thin film deposition technologies. MEM vacuum sealing techniques are for example described in the article of Jin Y et al.: "MEMS Vacuum Packaging Technology and Applications"; *IEEE, Electronics Packaging Technology Conference* 2003: 301-306.

To maintain the vacuum in the cavity throughout the operational life of the component, it is usual to add materials to it that are going to assure an in situ pumping of the residual gases, known as "getter" materials. Numerous metals thus have getter properties: barium, magnesium, aluminium, thorium, vanadium, etc., and in particular titanium, which is very widely used in integrated technologies; their performance is well known to those skilled in the art.

Getters may be classed into several categories, each being able to be introduced by different techniques: physical getters and chemical getters, which themselves may be separated into two. Chemical evaporable getters are for instance materials that are evaporated under vacuum once the cavity has been sealed and condense on the walls of said cavity in which it is wished to maintain a vacuum. The film thereby formed is very reactive and forms an in situ pump. Barium and aluminium/barium alloys are principally used as evaporable getters, for example in CRT (Cathode Ray Tubes). Another evaporable getter pump is the titanium sublimation pump (TSP) in which titanium or an alloy of titanium and molybdenum are sublimed and condensed on the cold walls of the body of the pump.

In parallel, chemical non evaporable getters or NEGs exist; these are principally alloys based on zirconium, vanadium, iron or titanium. The NEGs remain in the solid state. They are activated by a suitable heat treatment, and may then adsorb and/or absorb certain gases, such as $H_2$, CO, $N_2$, $CO_2$, $O_2$, etc.

By way of example, the SAES Getters Company commercialises different NEGs: St122™ is an alloy based on titanium, St707™ is an ZrVFe alloy (70% zirconium, 24.6% vanadium and 5.4% iron), which are deposited by serigraphy in thin films on a metallic substrate. For MEMS applications, these getters are in general integrated by placing and bonding ("Pick & Place" type technique).

At the moment, NEG getters are often used for the packaging of non-cooled microsystems or bolometers; they may be positioned and bonded to host cavities provided for this purpose on the substrate. Another technique is direct deposition of a thin film the material on the lid (see for example document WO 02/42716); the getter may be soldered to the film, which also serves as a bead for the eutectic sealing.

In the case of NEG deposited in thin films, one problem is the saturation that occurs during the "vacuum breaking" phases before or during the step of sealing of the cavity, in other words not maintaining the controlled atmosphere. Indeed, the external part of the sorption layer may react during the air exposure time during the MEMS encapsulation method, and thus become saturated, thereby subsequently limiting its "getter" performance. Although the getter material is capable of being regenerated by heating, it is preferable to protect its surface up to sealing in order to avoid the sorption element not being saturated and/or its performance not being degraded during the process of manufacturing the microdevice.

Another problem linked to the presence of a surface getter film is that this film may be incompatible with certain conventional micro-machining techniques (for example when employing certain resins, chemical or reactive etchings, etc.), which limits the possible choices of manufacturing methods.

The document US 2003/0138656 proposes as solution covering the getter material with a non reactive film that plays the role of protection during vacuum breaking. A subsequent heat treatment allows the getter material to diffuse in the non reactive film, ultimately fulfilling its pumping function. The diffusion of the getter material in the non reactive material reduces however its absorption properties.

The problem of protecting the sorption material while it is being integrated in the MEMS cavity is therefore not resolved.

DISCLOSURE OF THE INVENTION

Based on the understanding of pumping mechanisms and the behaviour of getters in thin films, the invention proposes a low cost method of integrating these pumps in microsystems, thereby increasing their operational life at the specified pressure.

Under one of its aspects, the invention concerns a method for installing a sorption element in a cavity, particularly a microelectronic or micromechanical device, in the form of a zone, preferably a thin film, for example between 0.1 and 10 micrometers, in getter material, for example titanium. The cavity may comprise moreover a microelectronic component, or a MEMS, or a bolometer, or any other component, the operation of which recommends placing it in a cavity at controlled atmosphere and more or less strong vacuum.

A reaction element is installed in the cavity, preferably at a non-zero distance from the getter film, on the same wall, the opposite wall, or even as cavity sealing bead. The reaction zone may take different configurations compared to the sorption element: it may form a continuous frame around it, or surround it only partially, or comprise different reaction blocks spread around the getter zone, or even partially covering said getter zone.

Moreover, the getter material zone is covered, at least partially but preferably entirely, by a protection zone. It may be a deposited protective film, which may have a thickness of between 0.1 and 10 micrometers; its material is inert vis-à-vis the getter material, in other words it is stable and non wetting.

The method as set forth in the invention then comprises raising the temperature of the assembly, during the sealing of the cavity or after placing it under vacuum, which causes the reaction between the protective zone and reaction element: the protective material is moved, by "aspiration" or "consumption", towards the reaction zone to become localised there or even to be integrated there, so that the getter material zone is no longer covered with the protective zone and remains free, at least partially. The movement of the protective material to remove the protective zone and release the getter zone preferably takes place between 200 and 500° C.

The removal of the protective element is principally achieved by melting of one of the protective and reactive materials. For example, it is possible that the reaction material is a fusible material, such as an alloy based on tin or an Au/Si alloy, which, when the temperature is raised, reacts with the protective zone, for example in gold, silver or platinum, by consuming it thereby releasing the getter zone. The fusible reaction material is preferably integral with a wetting material to remain in place and not alter the getter or the active compound. The reaction element may be in contact with the protective zone at low temperature, or uniquely when the melting temperature is reached.

Inversely, the protective material may comprise a material, in particular an alloy based on tin, that melts at a removal temperature reached when the temperature is increased; in this case, the reaction element is preferably wetting for this material, for example gold, so that the protective material, as it melts, is attracted by the reaction material to release the getter zone. The protective zone may moreover comprise a second material, for example in two layer form, carried along by the fusible material while it moves.

Under another aspect, the invention concerns a device stemming from a method described previously, at an intermediate or final step.

BRIEF DESCRIPTION OF DRAWINGS

The characteristics and advantages of the invention may best be understood on reading the following detailed description taken in conjunction with the accompanying drawings. These drawings are provided as an indication only and in no way limit the scope of the invention.

DETAILED DESCRIPTION OF SPECIFIC EMBODIMENTS

Figure 1A:
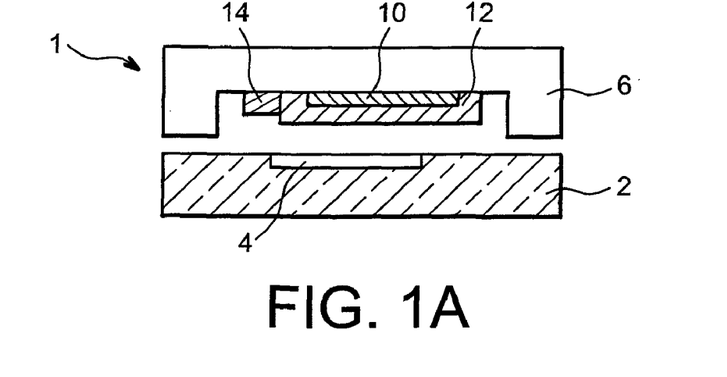
FIGS. 1A to 1C illustrate the protection of a getter film as set forth in the invention.

As is normal before encapsulation, a microdevice 1, shown schematically in FIG. 1A, comprises a substrate 2, for example in semi-conductor material such as silicon, on which may be positioned an active compound 4. A lid 6, for example in glass or in semi-conductor material, with a recess enables, by transfer of the lid 6 onto the substrate 2, a cavity 8 to be created in which the active compound 4 may fit; this cavity has dimensions ranging from 1 mm$^2$ to several cm$^2$; the active compound 4 may be a sensor type micromechanical system that may comprise suspended elements (accelerometer, gyrometer, bolometer, etc.). It is clear that the compound 4 may be located in the lid 6, or that the lid may be added by different techniques on the substrate 2. For example, the lid 6 may also be flat, without recesses, and the cavity 8 may be created by added solder beads. The substrate 2 may also have been recessed.

The cavity 8 moreover accommodates a getter material 10. The getter material may comprise an alloy based on Zr, V, Fe, Ti, or even a metallic zone based on Ba, Mo, Mg, Al, Th, Ti, Zr, Va, Fe, Pd, or any other material having absorption properties. Preferably, it is titanium, the sorption capacities of which are high.

The getter material is arranged preferably in the form of a film, advantageously a thin film, with a thickness between 100 nm and 10 μm, which has for example been evaporated or sputtered under vacuum; in this case of sputtering, the methods are arranged to reduce the quantity of neutral gas incorporated during the deposition and capable of being released in the cavity 8 during the thermal step. According to a normal embodiment illustrated, the film of getter material 10 is deposited on the wall of the cavity 8 facing the wall comprising the active zone 4, in other words in this case in the lid 6, but it is clear that alternatives are possible, with for example a film 10 adjacent to the compound 4, or even arranged on a part of the compound 4, for example on the suspended elements of an accelerometer, etc.

When the lid 6 is transferred to the substrate 2, it is difficult to maintain the vacuum used while depositing the getter film 10. In order to achieve a protection of the getter 10 and thereby avoid its saturation before it is even placed under the controlled atmosphere of the cavity 8, the getter film 10 is covered by a protective material 12. The protective film material 12 may partially cover the getter material but, advantageously, it covers it totally, in other words the surface area of the protective film 12 is greater than the surface area of the getter material 10 and encompasses it. Advantageously, the protective film 12 may be deposited in situ on the film of getter material 10, in other words in the getter material deposition equipment without breaking the vacuum.

The protective film 12 may be deposited in one or several steps. Thus, for example, to localise the getter film 10, a step of etching of the getter film—protective film stacking may be carried out; it may be useful, after etching, to carry out another protector 12 deposition to protect the getter zones laid bare at the level of the etching sides.

The protective material 12 is chosen so as not to interact with the getter material 10; in particular, the protective zone 12 is stable and capable of correctly enrobing the getter material so as to protect it. Its thickness depends on its nature, but preferably remains thin, around 0.1 to 1 μm to be able to be completely removed.

The protective material is moreover chosen for its reactional properties during a heat treatment. In particular, when the temperature of the cavity 8 is increased enabling the removal temperature to be reached or exceeded, the protective material 12 is capable of releasing the surface of the getter 10 by reacting with a reaction material 14 that moves physically. The temperature is increased while the vacuum may be installed and maintained in the cavity 8, during or after the sealing of the cavity 8.

Figure 1B:
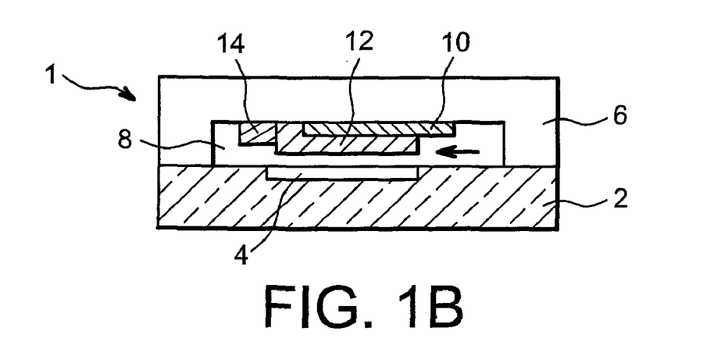

As illustrated in FIG. 1, the protective material 12 is thus in contact with a reaction zone 14. At the removal temperature or above, the reaction material 14 "sucks up" the protective material 12, through creep or consumption as will be made clear later: FIG. 1B. It is advantageous that the protective film 12 and the reactive material 14 do not wet well on the getter material 10; this also favours the use of titanium as getter material since Ti is non wetting for many alloys.

Figure 1C:
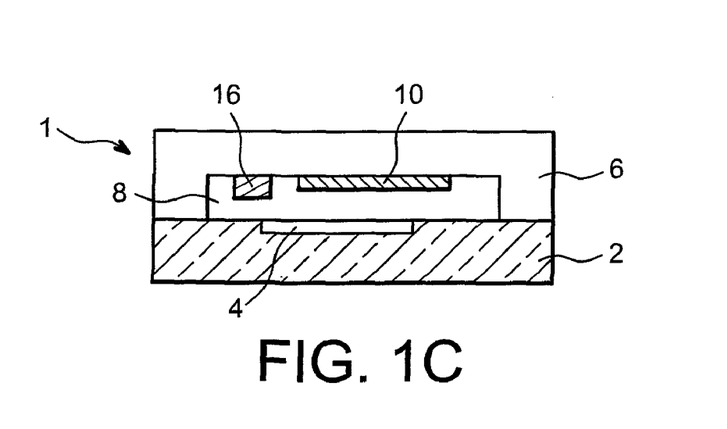

The protective film 12 therefore progressively releases the getter film 10, to end up with a microdevice 1 according to FIG. 1C, wherein a free getter film 10 is facing the active zone 4 within a cavity 8, in which a more or less strong vacuum prevails, and comprising an element 16, the composition of which is a more or less homogeneous mixture of reaction 14 and protective 12 materials.

To displace the protective material, and thereby remove the protective film 12, different solutions may be envisaged.

Figure 2A:
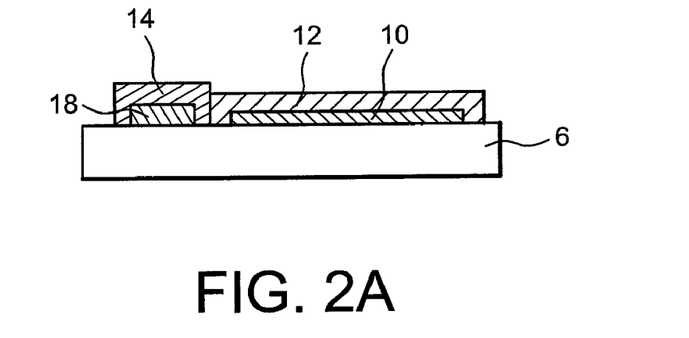
FIGS. 2A to 2C show a preferred embodiment of a method as set forth in the invention.
Figure 2B:
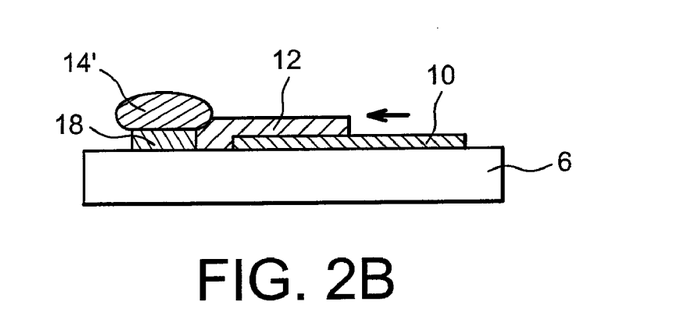

In particular, as shown schematically in FIG. 2, it is possible that the protective film 12 is consumed by a material melting locally: during the rise in temperature, the reaction material 14, which melts at the removal temperature, deforms in order to create a drop 14' (FIG. 2B). Depending on the nature of the melting material, the drop 14' may attract a material in contact with it, for example the protective film 12. The protective film 12 is therefore arranged so as to be close to the reaction element 14 and to be in contact with it when it is in the form of a drop; preferably, it is adjacent to it even at a temperature lower than the melting temperature of the reaction material.

Many possible pairings exist for the protective film 12 and the reactive material 14. In particular, precious metals such as Au, Ag or Pt are good candidates as protective materials 12: they may be deposited in thin film, they are very stable and they are very easily consumed by reactive alloys 14, particularly an Au/Si alloy or an alloy based on tin, for example Sn/Bi, Sn/Pb In/Sn, Sn/Pb, Sn/Pb/Ag, Sn/Ag, etc. However, the protective film 12 may be formed in any other less noble material if a material or reactive alloy exists that can absorb it: for example copper may be used, or aluminium, or even Al/Au/Si.

In this case where the reaction material 14 is fusible, it may be preferable to have previously defined a wetting zone 18 on which the reactive element 14 is installed: when the protective film 12 melts and while it is being consumed, the drop 14' of reaction material stays in place, separated from the getter material 10. Gold is the most widely used wetting material 18; it is generally deposited in three Ti/Ni/Au or Ti/Pd/Au layers, titanium acting as the bonding film and nickel or palladium acting as the diffusion barrier.

By way of example, for an element such as illustrated in FIG. 2A, a film 10 of titanium of 100 nm to 10 µm is deposited under vacuum (by evaporation or sputtering), then covered by deposition by a film 12 of gold under vacuum (by evaporation or sputtering) of typical thickness from 100 nm to 1 µm, before breaking the vacuum. According to the embodiment, there may be the creation of patterning to define the positioning of the getter zone; this patterning may be formed by conventional microelectronic methods, particularly steps of deposition, photolithography, etching, etc. The wetting material 18 is then put in place, by successive depositions of Ti (bonding film), Ni (diffusion barrier) and Au (wetting film), for example by evaporation, sputtering or electrodeposition, each of the mono-layers being typically from 0.1 to 1 µm; depending on the case, there may also be patterning of the wetting material. On the wetting material 18 is deposited (evaporation, sputtering, electrodeposition) a film 14 of eutectic alloy Au/Sn (80/20%), of thickness of around 100 nm to 10 µm; there may also be creation of patterning.

Figure 2C:
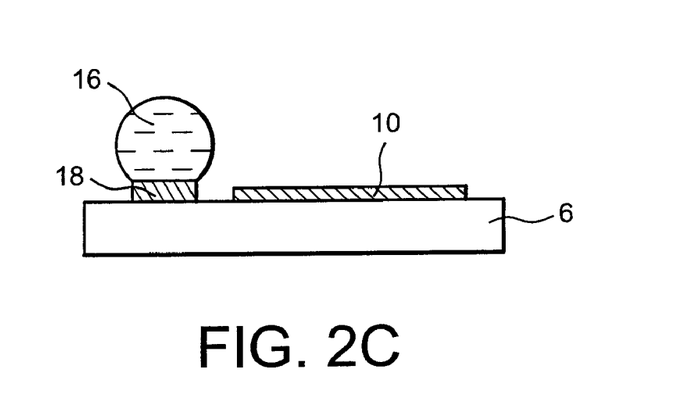

In this example, the absorption conditions of the protective film 12 by the reactive material 14 are an annealing beyond 280° C. for several seconds to several minutes to go from the compound shown schematically in FIG. 2A to that of FIG. 2C. Naturally, installing the wetting film 18, or even the reactive material 14, before the getter film 10 and/or the protective film 12 may be envisaged.

Figure 3A:
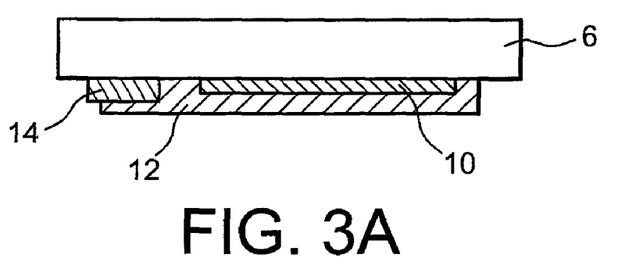
FIGS. 3A and 3B show another preferred embodiment of a method as set forth in the invention.
Figure 3B:
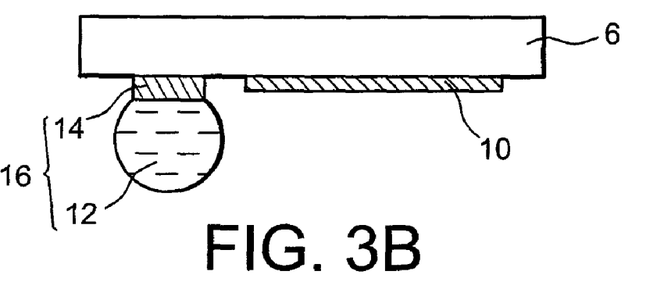

As illustrated in FIG. 3, it is possible that the protective material 12 itself is fusible at the removal temperature: the protective film 12 moves through surface tension towards the previously defined reactive wetting zones 14. Once again, many fusible alloy/wetting film pairings are possible. By way of example, the alloys 12 Sn/Pb or Sn/Ag are particularly advisable, since they do not wet on most materials used as getters 10, and in particular titanium, but wet very well on a material 14 such as gold. The reactive wetting material 14 is generally deposited in three Ti/Ni/Au or Ti/Pd/Au layers as disclosed above.

An embodiment of a device according to FIG. 3A comprises a titanium film 10 of 100 nm to 10 µm deposited under vacuum (by evaporation or sputtering); depending on the embodiment, there may be creation of patterning. The reactive wetting material 14 is then, or beforehand, put in place, by successive depositions of Ti (bonding film), Ni (diffusion barrier) and Au (wetting film), for example by evaporation, sputtering or electrodeposition, each of the single layers being typically from 0.1 to 1 µm; depending on the patterning chosen, there may also be patterning of the wetting material 14. The two elements 10, 14 are covered by deposition of a film 12 of the alloy Sn/Ag (96.5/3.5%) under vacuum (by evaporation or sputtering) of typical thickness from 100 nm to 1 µm, before breaking the vacuum.

In this example, the conditions of adsorption of the protective film 12 by the reactive material 14 to form the heterogeneous material 16 illustrated in FIG. 3B are an annealing above 200° C. for several seconds to several minutes.

Figure 4:
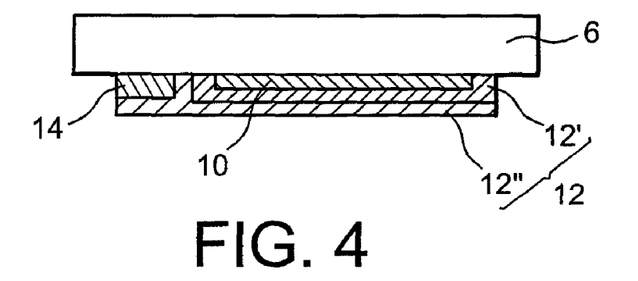
FIG. 4 shows another preferred embodiment of a method as set forth in the invention.

The protective film 12 may moreover be composed both of a film 12' playing the role of consumable "inert" protection, such as gold, and a fusible material 12", as illustrated in FIG. 4: the reaction element 14 then comprises a wetting material, and the rise in temperature causes the fusible material 12" of the protective film 12 to flow towards the wetting zones 14, while at the same time consuming the inert film 12'. Other geometries are possible.

Figure 5A:
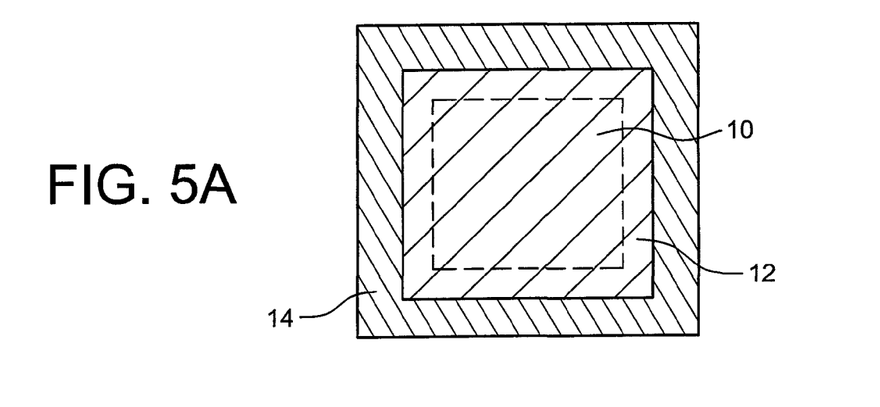
FIGS. 5 to 7 shows schematically possible geometries for a protection as set forth in the invention, while indices A, B, C show the protection steps at the release of the getter.
Figure 5B:
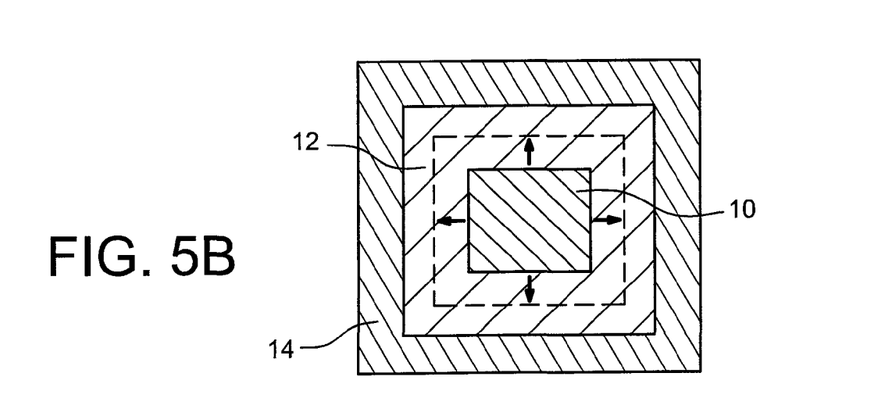
Figure 5C:
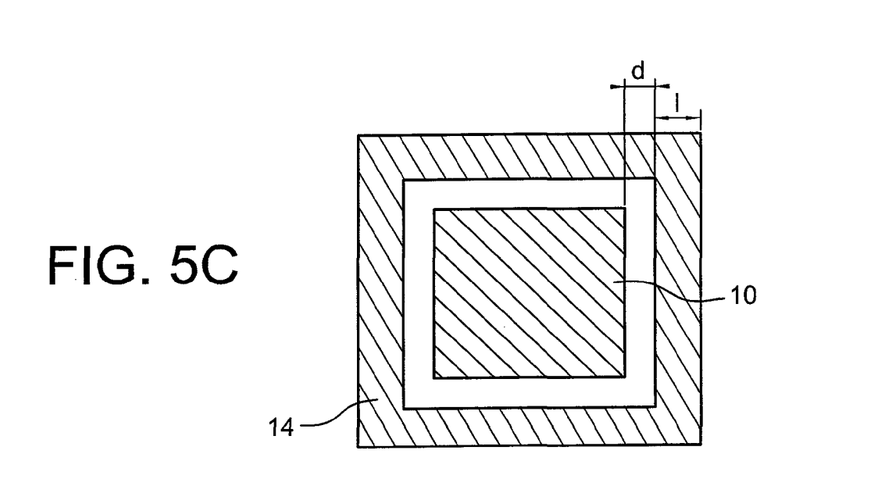
Figure 6A:
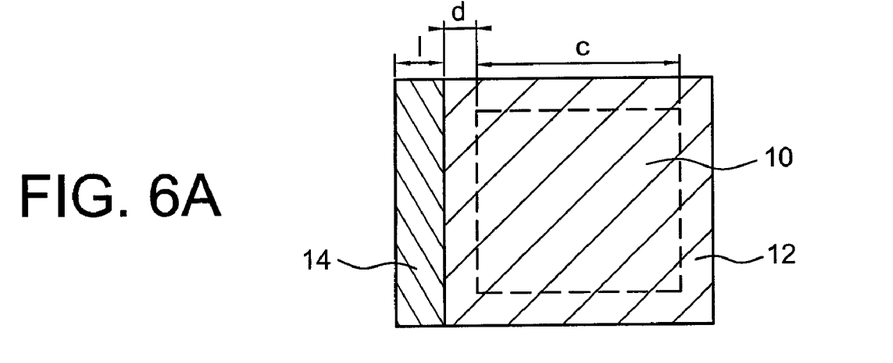
Figure 6B:
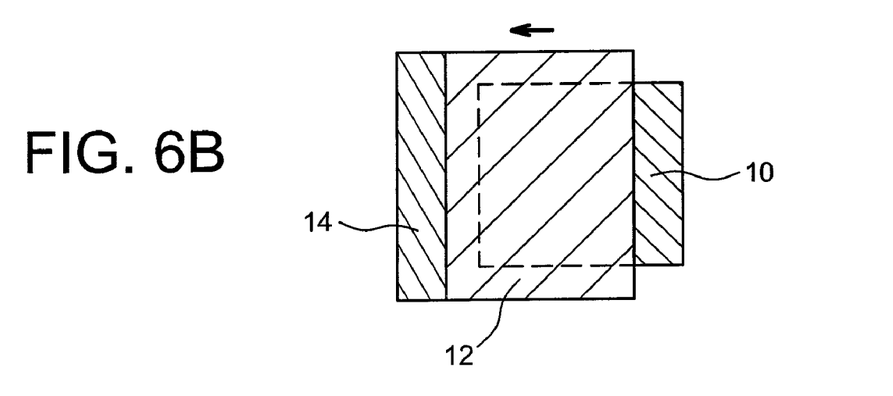
Figure 6C:
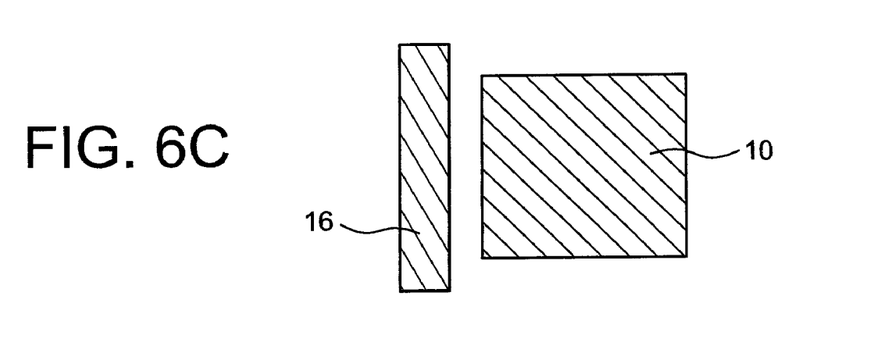
Figure 7A:
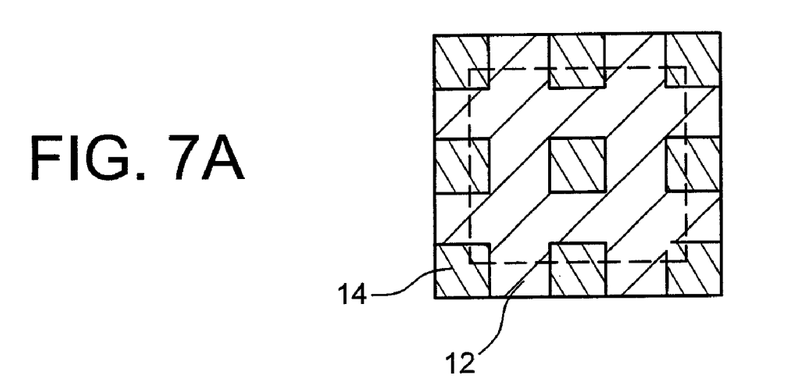
Figure 7B:
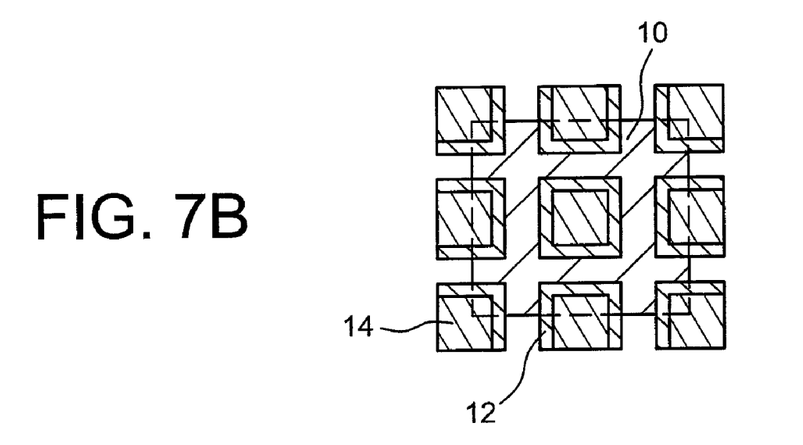
Figure 7C:
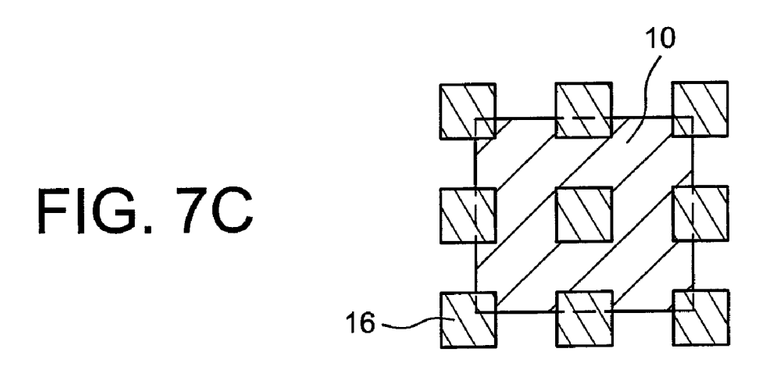

The reaction element 14 has been shown as placed on one side of the getter film 10. In fact, numerous configurations are possible, as illustrated in FIGS. 5, 6 and 7: in the framework represented, the getter material 10 forms a film of sides c between 50 µm and 1 cm; the protective film 12 completely covers the getter film 10 and extends beyond it on each side; the reaction material 14 is in the form of a strip of width 1 of around 10 µm to 1 mm, separated from the getter film by a distance d of around several microns; in an alternative embodiment, if the reaction material does not react with the getter material 10, it may be adjacent to it, or even overlap it (FIG. 7). The reaction material 14 may totally surround the getter film 10 (FIG. 5) or partially (FIG. 6) or be arranged in openwork network form (FIG. 7). The steps A, B, C repeat the steps of FIG. 1 and illustrate the release of the getter film 10 and the displacement of the protective material 12. Obviously, other configurations are possible, depending on the size and the nature of the getter zone 10, the removal temperature reached, and the rate of reaction for the removal among others.

Figure 8:
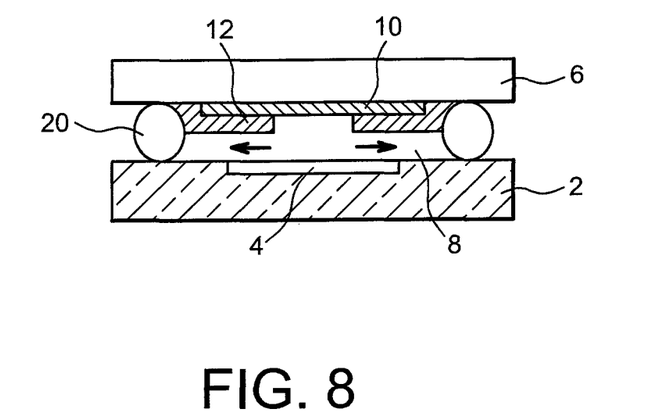
FIG. 8 shows an alterative embodiment of a protection as set forth in the invention.

A specific example, illustrated in FIG. 8, concerns a reaction material 14 that also serves as sealing bead 20 of the cavity 8 for a eutectic sealing: a bead 20 in Au/Si or in Sn/Pb or in Sn/Ag is heated once the lid 6 has been put back on the substrate 2 in order to assure the sealing of the cavity 8; at the same time, it can consume a film 12 of gold deposited beforehand to protect the getter material 10.

Figure 9A:
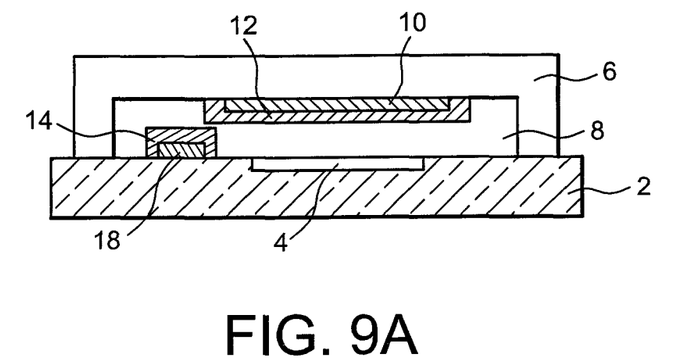
FIGS. 9A and 9B show an alternative embodiment of the protection as set forth in the invention.
Figure 9B:
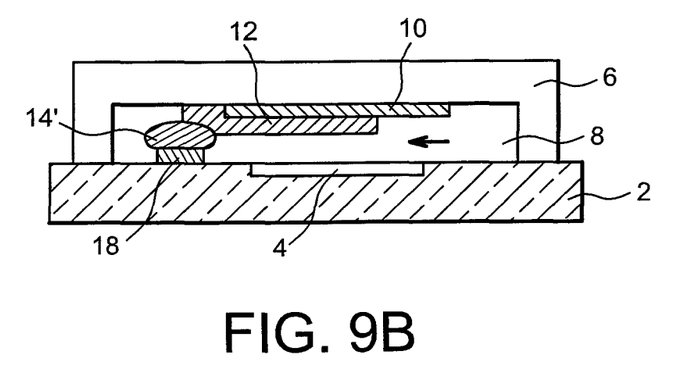

Moreover, in particular in the case where the protective film 12 is consumed by a melting reactive material 14, it may also be envisaged to place the reaction element 14 on the wall of the cavity 8 opposite the getter material 10 coated with its protective film 12, in particular on the substrate 2: see FIG. 9A. It is preferable to install the reaction material 14 (for example Au/Si, Sn/Pb or Sn/Ag) on a wetting zone 18 to avoid contaminating the active zone 4; it is also preferable that this wetting zone 18 is of limited size so that the melting reactive material 14, which forms a drop 14' on the wetting zone 18, concentrates at this point and comes into contact with the protective film 12 (for example in gold) and consumes it (FIG. 9B). Preferably, the two elements 12, 14 are not in contact at ambient temperature, and only become adjacent when the melting temperature is reached or exceeded.

The method as set forth in the invention is particularly easy to use, and does not necessitate any costly modification of encapsulation technologies. In particular, the removal of the protective film may be carried out in parallel with the sealing of the cavity, and is normally accompanied by a regeneration of the getter material by raising the temperature. The method enables the use of thin films deposited directly on one surface of the cavity, or even several surfaces if necessary, by optimising the quantity of getter material.

The invention claimed is:

1. A method for installing a sorption element in a cavity comprising:
    disposing, within the cavity, a getter material, a reaction material, and a protective material, said protective material covering at least one part of the getter material so as to bury said at least one part;
    raising a temperature up to at least one removal temperature; and
    moving the protective material towards the reaction material by reaction between the protective material and the reaction material so that at least one portion of said part of the getter material is no longer covered with the protective material.

2. The method according to claim 1, wherein the getter material is produced in a form of a thin film of thickness between 100 nm and 10 µm.

3. The method according to one of claims 1 to 2, wherein the protective material is produced in a form of a thin film of thickness between 100 nm and 10 µm and entirely covers the getter material.

4. The method according to claim 1, wherein the protective material is stable and non wetting vis-à-vis the getter material.

5. The method according to claim 1, wherein the getter material is titanium.

6. The method according to claim 1, wherein the at least one removal temperature ranges from 200 to 500° C.

7. The method according to claim 1, wherein the reaction material is a fusible material at the at least one removal temperature.

8. The method according to claim 7, wherein the reaction material is positioned at least partially on a wetting material for the reaction material.

9. The method according to claim 7, wherein the protective material is Au, Ag or Pt, and the reaction material is an Au/Si alloy or alloys based on tin.

10. The method according to claim 1, wherein the protective material comprises a material that melts at the at least one removal temperature.

11. The method according to claim 10, wherein the reaction material is a wetting material for the protective material.

12. The method according to claim 10, wherein the protective material is is an alloy based on tin, and the reaction material is gold.

13. The method according to claim 1, wherein the reaction material is positioned on the a same wall of the cavity as the getter material.

14. The method according to claim 1, wherein the reaction material is placed on a wall of the cavity opposite a wall bearing the getter material.

15. The method according to claim 1, wherein the reaction material is in a form of a ring framing the getter material.

16. The method according to claim 1, wherein the reaction material comprises several reaction blocks arranged in network form at a level of the getter material.

17. The method according to claim 1, wherein the reaction material constitutes at least one wall of the cavity.

18. The method according to claim 1, further comprising a step of sealing of the cavity before or during the raising of the temperature.

19. The method according to claim 1, wherein the cavity comprises a microsystem.

20. The method according to claim 1, wherein the at least one removal temperature is a minimum removal temperature that corresponds to a temperature allowing the protective material to react with the reaction material in order to generate removal of the reaction material from the at least one portion of said part of the getter material.

* * * * *